(12) United States Patent
Oue et al.

(10) Patent No.: US 7,952,095 B2
(45) Date of Patent: May 31, 2011

(54) DISPLAY DEVICE AND MANUFACTURING METHOD THEREFOR

(75) Inventors: Eiji Oue, Mobara (JP); Takuo Kaitoh, Mobara (JP); Hidekazu Miyake, Mobara (JP); Toshio Miyazawa, Chiba (JP); Yuichiro Takashina, Ichihara (JP)

(73) Assignee: Hitachi Displays, Ltd., Chiba (JP)

( * ) Notice: Subject to any disclaimer, the term of this patent is extended or adjusted under 35 U.S.C. 154(b) by 308 days.

(21) Appl. No.: 12/208,371

(22) Filed: Sep. 11, 2008

(65) Prior Publication Data
US 2009/0065777 A1 Mar. 12, 2009

(30) Foreign Application Priority Data
Sep. 11, 2007 (JP) .................. 2007-234836

(51) Int. Cl.
*H01L 29/04* (2006.01)
*H01L 21/00* (2006.01)
(52) U.S. Cl. .................. 257/59; 438/158; 257/E21.001; 257/E33.003
(58) Field of Classification Search ............. 257/59, 257/E21.001, E33.003, E33.004; 438/158, 438/29
See application file for complete search history.

(56) References Cited

U.S. PATENT DOCUMENTS

| 6,509,614 | B1 * | 1/2003 | Shih ............................ 257/350 |
| 6,693,044 | B1 * | 2/2004 | Yamazaki et al. ............ 438/745 |
| 2001/0028057 | A1 * | 10/2001 | Tanaka et al. .................. 257/59 |
| 2002/0119609 | A1 | 8/2002 | Hatano et al. |
| 2007/0075322 | A1 | 4/2007 | Nakamura et al. |

FOREIGN PATENT DOCUMENTS

| JP | 05-107560 | 4/1993 |
| KR | 20050105867 | 11/2005 |

\* cited by examiner

*Primary Examiner* — Lex Malsawma
(74) *Attorney, Agent, or Firm* — Antonelli, Terry, Stout & Kraus, LLP.

(57) ABSTRACT

In a display device of the present invention which forms thin film transistors on a substrate, the thin film transistor comprises: a silicon nitride film which is formed on the substrate in a state that the silicon nitride film covers a gate electrode; a silicon oxide film which is selectively formed on the silicon nitride film; a semiconductor layer which is formed at least on an upper surface of the silicon oxide film and includes a pseudo single crystal layer or a polycrystalline layer; and a drain electrode and a source electrode which are formed on an upper surface of the semiconductor layer by way of a contact layer, wherein either one of the pseudo single crystal layer and the poly-crystalline layer is formed by crystallizing the amorphous silicon layer, and a peripheral-side wall surface of the pseudo single crystal layer or the polycrystalline layer is contiguously constituted with a peripheral-side wall surface of the silicon oxide film below the pseudo single crystal layer or the polycrystalline layer without a stepped portion.

7 Claims, 6 Drawing Sheets

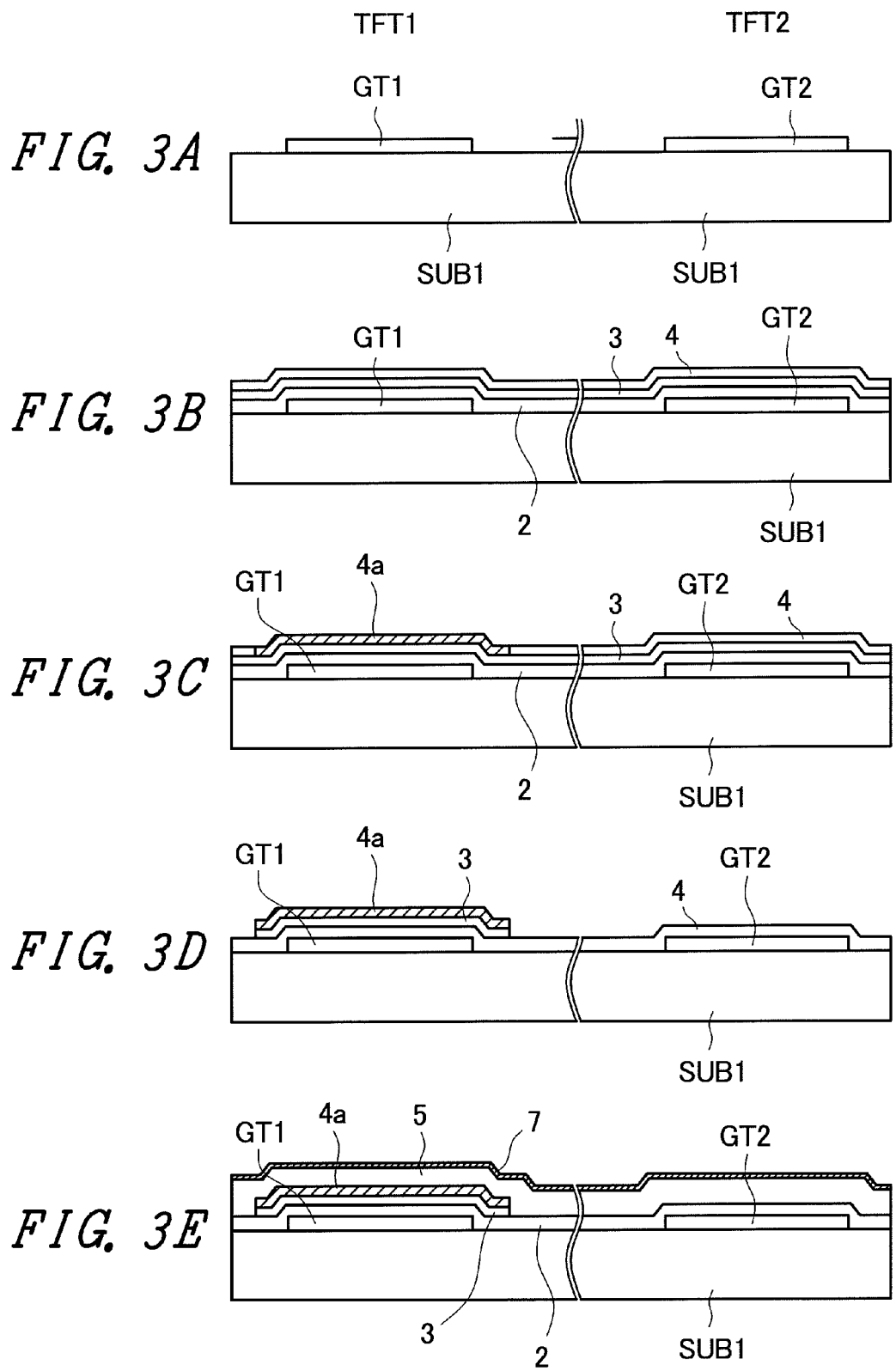

_US 7,952,095 B2_

DISPLAY DEVICE AND MANUFACTURING METHOD THEREFOR

The present application claims priority from Japanese applications JP2007-234836 filed on Sep. 11, 2007, the content of which is hereby incorporated by reference into this application.

BACKGROUND OF THE INVENTION

The present invention relates to a display device, and more particularly to a display device which forms thin film transistors on a substrate.

As such a display device, there has been known a display device which is configured such that thin film transistors for selecting pixels are formed in respective pixels with in a display region on a substrate surface of the display device and, at the same time, a peripheral circuit for driving the respective pixels is formed on a periphery of the display region, and the peripheral circuit includes a plurality of thin film transistors.

Here, in manufacturing such a display device, for enhancing the manufacturing efficiency of the display device, usually, the thin film transistor for selecting the pixel and the thin film transistor for the peripheral circuit are formed simultaneously with each other.

Further, there has been known a technique in which as a thin film transistor for selecting a pixel, a semiconductor layer is made of amorphous silicon (a-Si), while as a thin film transistor of the peripheral circuit, a semiconductor layer is made of poly-crystalline silicon which is produced by crystallizing amorphous silicon using a pseudo single crystal technique, for example. This technique is adopted because when the semiconductor layer is made of polycrystalline silicon, it is possible to obtain a thin film transistor having excellent mobility.

In this case, there has been known that, by using a silicon nitride film as a gate insulation film in a thin film transistor which forms the semiconductor layer using amorphous silicon, and by using a silicon oxide film as a gate insulation film in a thin film transistor which forms a semiconductor layer using polycrystalline silicon, it is possible to enhance characteristics of the respective thin film transistors.

The display device having such constitution is disclosed in JP-A-5-107560 (patent document 1) with a manufacturing method of the display device.

SUMMARY OF THE INVENTION

However, in the display device disclosed in the patent document 1, gate electrodes of the thin film transistors for selecting the pixels and gate electrodes of the thin film transistors of the peripheral circuit are formed on a main surface of the substrate of the display device and, thereafter, first of all, a silicon nitride film is formed on a peripheral surface of the substrate in a state that the silicon nitride film covers the gate electrodes.

Then, a silicon oxide film is formed on an upper surface of the silicon nitride film, and the silicon oxide film is selectively etched thus leaving the silicon oxide film in a region where the peripheral circuit is formed.

Then, an amorphous silicon layer is formed on a main surface of the substrate, and regions of the amorphous silicon layer where the semiconductor layers of the respective thin film transistors of the peripheral circuit are formed are selectively crystallized thus forming polysilicon films.

Due to such constitution, in performing the selective etching of the silicon oxide film, there arises a drawback that foreign materials intrude into the silicon oxide film and the silicon nitride film or the silicon oxide film and the silicon nitride film are contaminated with such foreign materials.

Further, with respect to the display device disclosed in patent document 1, it is estimated that the silicon oxide film is formed to extend over the region where the peripheral circuit is formed and hence, for example, when it is necessary to establish the electric connection between the gate electrode and a drain electrode (source electrode) of the thin film transistor, there arises a drawback that the reliability of the electrical connection cannot be acquired sufficiently.

That is, the electrical connection between the gate electrode and the drain electrode (source electrode) of the thin film transistor is established via a metal film formed in a through hole formed in the silicon nitride film and the silicon oxide film which are stacked with each other. Here, in forming the through hole, an undercut occurs in the silicon nitride film below the silicon oxide film, and due to a stepped portion formed on a side wall surface of the through hole, a broken step easily occurs in the metal film.

It is an object of the present invention to provide a display device including a thin film transistor which can prevent the intrusion of foreign materials into a gate insulation film or the contamination of the gate insulation film with the foreign materials.

It is an object of the present invention to provide a display device which can enhance the reliability of the electrical connection via a through hole.

To briefly explain the summary of typical invention among inventions disclosed in this specification, they are as follows.

(1) In a display device of the present invention which forms thin film transistors on a substrate, the thin film transistor comprises: a silicon nitride film which is formed on the substrate in a state that the silicon nitride film covers a gate electrode; a silicon oxide film which is selectively formed on the silicon nitride film; a semiconductor layer which is formed at least on an upper surface of the silicon oxide film and includes a pseudo single crystal layer or a polycrystalline layer; and a drain electrode and a source electrode which are formed on an upper surface of the semiconductor layer by way of a contact layer, wherein either one of the pseudo single crystal layer and the poly-crystalline layer is formed by crystallizing the amorphous silicon layer, and a peripheral-side wall surface of the pseudo single crystal layer or the polycrystalline layer is contiguously constituted with a peripheral-side wall surface of the silicon oxide film below the pseudo single crystal layer or the polycrystalline layer without a stepped portion.

(2) In a display device of the present invention, a thin film transistor is formed in respective pixels of a display region and in a peripheral circuit around the display region on a substrate surface respectively, and the thin film transistor formed in the peripheral circuit is constituted of the thin film transistor described in item (1).

(3) A display device of the present invention is, on a premise the constitution of item (2), characterized in that the thin film transistor formed in the pixel of the display region includes: the silicon nitride film which is formed on the substrate in a state that the silicon nitride film covers a gate electrode; an amorphous silicon layer which is formed on an upper surface of the silicon nitride film; and a drain electrode and a source electrode which are formed on an upper surface of the amorphous silicon layer by way of a contact layer.

(4) In a display device of the present invention which includes switching elements which are configured to supply video signals to respective pixels allocated to red(R), green (G) and blue (B) by time-division driving, the switching element is constituted of the thin film transistor described in item (1).

(5) In a method of manufacturing a display device which forms thin film transistors on a substrate of the display device, wherein the thin film transistor includes: a silicon nitride film which is formed on the substrate in a state that the silicon nitride film covers a gate electrode; a silicon oxide film which is selectively formed on the silicon nitride film; a semiconductor layer which is formed at least on an upper surface of the silicon oxide film and includes a pseudo single crystal layer or a polycrystalline layer; and a drain electrode and a source electrode which are formed on an upper surface of the semiconductor layer by way of a contact layer, and either one of the pseudo single crystal layer and the poly-crystalline layer is formed by crystallizing the amorphous silicon layer, the method of manufacturing the display device comprises the steps of: forming the silicon nitride film, the silicon oxide film and the amorphous silicon layer sequentially and continuously; forming the pseudo single crystal layer or the polycrystalline layer by selectively crystallizing the amorphous silicon layer; and etching also the silicon oxide film positioned below the amorphous silicon layer at the time of etching the amorphous silicon layer while leaving the pseudo single crystal layer or the polycrystalline layer.

Here, the present invention is not limited to the above-mentioned constitutions and various modifications are conceivable without departing from the technical concept of the present invention.

The display device having such constitution can obtain the thin film transistor which can prevent the intrusion of foreign materials into the gate insulation film and the contamination of the gate insulation film with a foreign material.

Further, the display device having such constitutions can enhance the reliability of electrical connection via a through hole.

BRIEF DESCRIPTION OF THE DRAWINGS

FIG. 3A to FIG. 3E are step views showing one embodiment of a manufacturing method of a thin film transistor which is formed on a substrate of the display device according to the present invention, and FIG. 3A to FIG. 3E are views showing the whole steps of the manufacturing method together with FIG. 4A to FIG. 4C;

FIG. 4A to FIG. 4C are views showing the whole steps of the manufacturing method together with FIG. 3A to FIG. 3E;

FIG. 5A to FIG. 5C are views showing the whole steps of the manufacturing method together with FIG. 6A to FIG. 6C;

FIG. 6A to FIG. 6C are views showing the whole steps of the manufacturing method together with FIG. 5A to FIG. 5C;

DESCRIPTION OF THE PREFERRED EMBODIMENTS

Hereinafter, embodiments of a display device according to the present invention are explained in conjunction with drawings.

(Schematic Constitution of Display Device)

Figure 2:
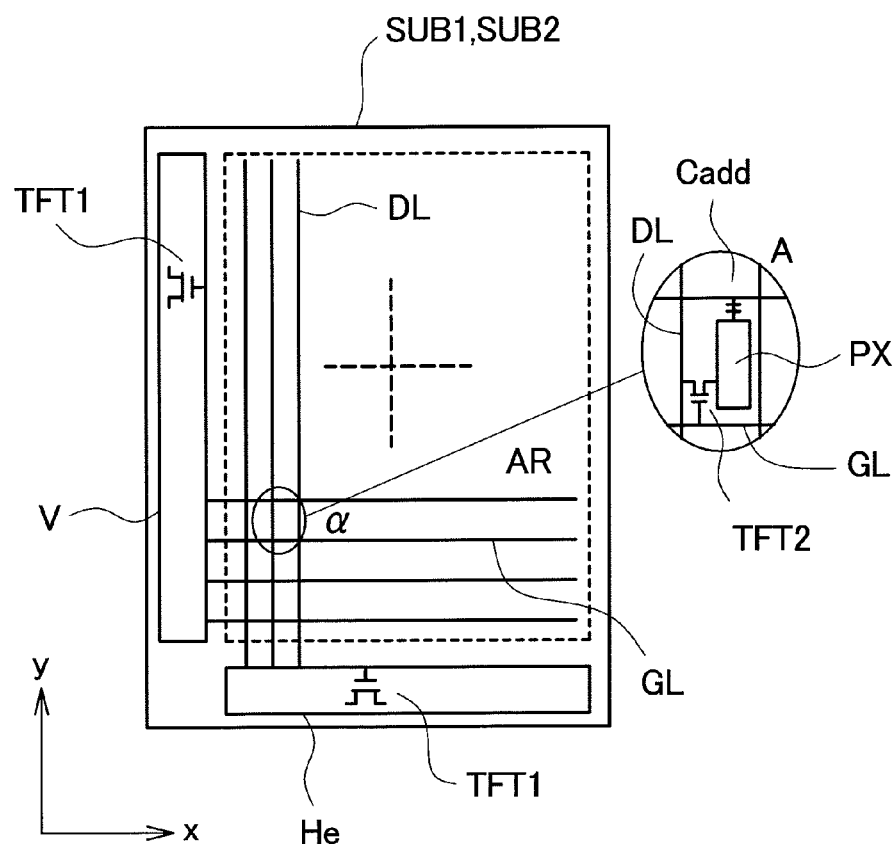
FIG. 2 is a schematic constitutional view showing one embodiment of the display device according to the present invention.

FIG. 2 is a schematic plan view of a display device according to the present invention. In FIG. 2, a liquid crystal display device is taken as an example of the display device.

In FIG. 2, the liquid crystal display device is configured such that an envelope is formed of substrates SUB1, SUB2 which are made of glass, for example, and are arranged to face each other in an opposed manner with a liquid crystal layer sandwiched therebetween, the liquid crystal layer is sealed between the substrates SUB1, SUB2 using a sealing material not shown in the drawing.

For example, on a liquid-crystal-side surface of the substrate SUB1, gate signal lines GL which extend in the x direction in the drawing and are arranged parallel to each other in the y direction in the drawing and drain signal lines DL which extend in the y direction in the drawing and are arranged parallel to each other in the x direction in the drawing are formed.

Further, a region which is surrounded by a pair of neighboring gate signal lines GL and a pair of neighboring drain signal lines DL constitutes a pixel region, and a liquid crystal display region AR is constituted of a mass of the pixel regions arranged in a matrix array.

The gate signal lines GL are connected to a scanning signal drive circuit V at a left end in the drawing, for example. Scanning signals from the scanning signal drive circuit V are supplied to the gate signal lines GL in order from the uppermost gate signal line GL to the lowermost gate signal line GL, and the supply of the scanning signal returns to the uppermost gate signal line GL, and the above-mentioned supply of the scanning signal is repeated.

The drain signal lines DL are connected to a video drive circuit He at a lower end in the drawing, for example. Video signals from the video drive circuit He are supplied to the drain signal lines DL at timing of the supply of the scanning signals.

Here, the scanning signal drive circuit V and the video signal drive circuit He are respectively constituted of a circuit which includes a plurality of thin film transistors THT1.

Further, as shown in FIG. A which shows an area surrounded by a solid line frame α in the drawing in an enlarged manner, the pixel region includes a thin film transistor TFT2 which is turned on with the supply of the scanning signal from the gate signal line GL, a pixel electrode PX to which the video signal from the drain signal line DL is supplied via the turned-on thin film transistor TFT2, and a capacitance element Cadd which is connected between the pixel electrode PX and a gate signal line GL which is arranged close to the pixel electrode PX and is different from the gate signal line GL for driving the thin film transistor TFT2.

The pixel electrode PX is configured to generate an electric field in a gap between the pixel electrode PX and a counter electrode (not shown in the drawing) which is formed on a liquid-crystal-side surface of the substrate SUB2 in common with respect to the respective pixel regions.

With respect to the liquid crystal display device having such constitution, in the manufacture of the constitution on the substrate SUB1, the scanning signal drive circuit V and the video signal drive circuit He are usually formed simultaneously with the pixel regions. Accordingly, the thin film transistors TFT1 and the thin film transistors TFT2 are formed together.

Here, in this embodiment, the thin film transistor TFT1 which is formed in the scanning signal drive circuit V or the video signal drive circuit He and the thin film transistor TFT2 which is formed in the pixel region differ from each other with respect to the materials and the constitutions of the gate insulation film and the semiconductor layer. Accordingly, by affixing symbol TFT1 to the former thin film transistor and symbol TFT2 to the latter thin film transistor, these thin film transistor are made distinguished from each other.

(Constitution of Semiconductor Device)

Figure 1:
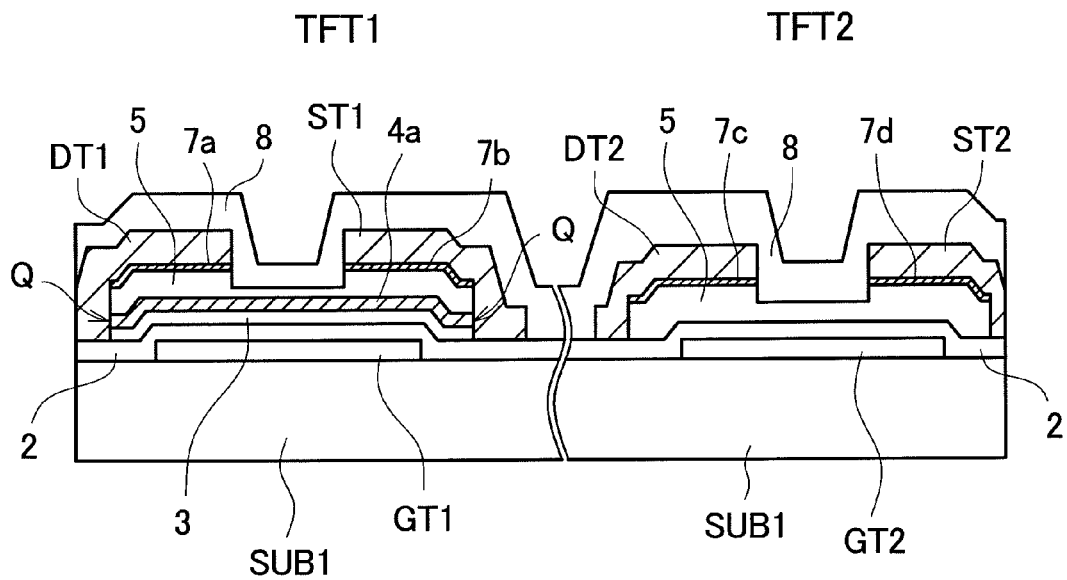
FIG. 1 is a cross-sectional view showing one embodiment of a thin film transistor formed on a substrate of a display device according to the present invention.

FIG. 1 is a constitutional view showing one embodiment of the thin film transistor which is formed in the display device according to the present invention.

In FIG. 1, the thin film transistor TFT1 which is depicted on a left side in the drawing is a thin film transistor which is formed in a peripheral circuit such as the scanning signal drive circuit V or the video signal drive circuit He. Here, the semiconductor layer of the thin film transistor TFT1 is constituted in a state that the thin film transistor TFT1 includes a pseudo single crystal layer (indicated by symbol 4a in the drawing) which is formed by pseudo single crystallizing an amorphous silicon layer, for example. Further, the thin film transistor TFT2 which is depicted on a right side in the drawing is a thin film transistor formed in the pixel region, wherein the semiconductor layer of the thin film transistor TFT2 is constituted of an amorphous silicon layer (indicated by numeral 5 in the drawing).

The thin film transistor TFT1 is constituted as follows. That is, a gate electrode GT1 is formed on a surface of the substrate SUB1 made of glass or the like, for example, and a silicon nitride film (SiN film) 2 is formed so as to cover the gate electrode GT1. The silicon nitride film 2 is formed in a state that the silicon nitride film 2 extends over a region where the thin film transistor TFT2 is formed.

On an upper surface of the silicon nitride film 2, a silicon oxide film ($SiO_2$ film) 3 is selectively formed so as to stride over the gate electrode GT1. Further, on an upper surface of the silicon oxide film 3, the pseudo single crystal layer 4a which is obtained by pseudo single crystallizing an amorphous silicon layer (indicated by numeral 4 in FIG. 3) is formed in an overlapped manner. Here, respective side wall surfaces (indicated by an arrow Q in the drawing) of peripheries of the silicon oxide film 3 and the pseudo single crystal layer 4a are continuously formed with each other thus forming no stepped portion between these side wall surfaces. This implies that the silicon oxide film 3 is formed only below the pseudo single crystal layer 4a and does not extend outwardly from the pseudo single crystal layer 4a as viewed in a plan view. An advantageous effect which is acquired by such constitution is described later.

Further, an island-shaped amorphous silicon layer 5 is formed on the pseudo single crystal layer 4a by stacking.

On an upper surface of the amorphous silicon layer 5, a drain electrode DT and a source electrode ST are formed as viewed in a plan view, wherein these electrodes DT, ST respectively have distal end portions thereof overlapped with the gate electrode GT1 and are arranged in a spaced apart manner from each other. Here, a high-density n-type amorphous silicon layer 7 (indicated by symbol 7a in the drawing) is interposed in an interface between the drain electrode DT and the amorphous silicon layer 5, and a high-density n-type amorphous silicon layer 7 (indicated by symbol 7b in the drawing) is interposed in an interface between the source electrode ST and the amorphous silicon layer 5.

Further, an upper surface of the thin film transistor TFT1 having such constitution is covered with a silicon nitride film 8. The silicon nitride film 8 is constituted of a film which extends over a region where the thin film transistor TFT2 is formed.

On the other hand, the thin film transistor TFT2 is constituted as follows. A gate electrode GT2 is formed on a surface of the glass substrate SUB1, and the above-mentioned silicon nitride film (SiN film) 2 is formed so as to cover the gate electrode GT2.

On an upper surface of the silicon nitride film 2, the above-mentioned island-shaped amorphous silicon layer 5 is formed astride the gate electrode GT2.

On the upper surface of the amorphous silicon layer 5, a drain electrode DT2 and a source electrode ST2 are formed as viewed in a plan view, wherein these electrodes DT2, ST2 respectively have distal end portions thereof overlapped with the gate electrode GT2 and are arranged in a spaced apart manner from each other. Here, a high-density n-type amorphous silicon layer 7 (indicated by symbol 7c in the drawing) is interposed in an interface between the drain electrode DT2 and the amorphous silicon layer 5, and a high-density n-type amorphous silicon layer 7 (indicated by symbol 7d in the drawing) is interposed in an interface between the source electrode ST2 and the amorphous silicon layer 5.

Then, an upper surface of the thin film transistor TFT2 having such constitution is covered with the silicon nitride film 8.

Here, the pseudo single crystal layer 4a of the thin film transistor TFT1 shown in FIG. 1 may be replaced with a polysilicon layer. This is because such constitution can also acquire the substantially same characteristic.

Further, although the thin film transistor TFT1 is constituted such that the amorphous silicon layer 5 is stacked on the pseudo single crystal layer 4a, the amorphous silicon layer 5 may not be formed.

(Manufacturing Method of Semiconductor Device)

FIG. 3 and FIG. 4 are step views showing one embodiment of the manufacturing method of the thin film transistors TFT1, TFT2 shown in FIG. 1. The region where the thin film transistor TFT1 is formed is shown on a left side of thre drawing, and the region where the thin film transistor TFT2 is formed on a right side of the drawing. Hereinafter, the manufacturing method of the thin film transistors TFT1, TFT2 is explained in order of steps.

Step 1: (FIG. 3A)

A substrate SUB1 made of glass, for example, is prepared. A metal film made of MoW or the like, for example, and having a thickness of 50 nm to 150 nm is formed on one surface of the substrate SUB1 by a sputtering method. Thereafter, the gate electrodes GT1, GT2 are formed on the metal film by a selective etching method using a photolithographic technique.

Step 2: (FIG. 3B)

On the surface of the substrate SUB1, the silicon nitride film (SiN film) 2 having a thickness of 300 nm is formed in a state that the silicon nitride film 2 covers the gate electrodes GT1, GT2. Subsequently, the silicon oxide film ($SiO_2$ film) 3 having a thickness of approximately 25 nm is formed on the silicon nitride film 2. Further, the amorphous silicon layer (a-Si film) 4 having a thickness of 50 nm to 150 nm is formed on the silicon oxide film 3.

The silicon nitride film 2, the silicon oxide film 3 and the amorphous silicon layer 4 are continuously formed using a CVD (Chemical Vapor Deposition) device, for example. Due to the continuous formation of the silicon nitride film 2, the silicon oxide film 3 and the amorphous silicon layer 4 using the same device, it is possible to acquire an advantageous effect that the intrusion of a foreign material into an interface between the respective films, the intrusion of a foreign material into the inside of the film, and the contamination of these films with a foreign material.

Step 3: (FIG. 3C)

By selectively applying laser annealing to a portion of a region where the amorphous silicon layer 4 is formed which corresponds to a region where the semiconductor layer of the thin film transistor TFT1 of the peripheral circuit is formed using a pseudo single crystallizing technique, the amorphous silicon layer 4 is modified thus forming the pseudo single crystal layer 4a.

In this case, as another embodiment of the present invention, the present is not limited to the modification of the amorphous silicon layer 4 into the pseudo single crystal layer 4a, a poly crystal layer may be formed by poly-crystallizing the amorphous silicon layer 4.

Step 4: (FIG. 3D)

A photoresist film (not shown in the drawing) is formed on the whole area of the amorphous silicon layer 4 (including the pseudo single crystal layer 4a), and only the photoresist film arranged on the pseudo single crystal layer 4a is left while removing the photoresist film on other area by a photolithography technique.

Next, using the remaining photoresist film as a mask, the amorphous silicon layer 4 (excluding the pseudo single crystal layer 4a) which is exposed from the mask is etched by dry etching, for example. Further, the silicon oxide film 3 which is exposed from the mask is etched by dry etching or wet etching.

Then, the remaining photoresist film is removed by ashing using oxygen plasma or by a releasing agent, for example.

Due to such treatment, in the region where the peripheral circuit is formed, the formation of the silicon oxide film 3 which constitutes the gate insulation film of the thin film transistor (using the pseudo single crystal layer 4a as the semiconductor layer) remains. On the other hand, in the region where the pixel is formed, the silicon nitride film 2 which constitutes the gate insulation film of the thin film transistor TFT2 (using the a-Si film as the semiconductor layer) is exposed.

Step 5: (FIG. 3E)

On the surface of the substrate SUB1, the amorphous silicon layer (a-Si film) 5 having a thickness of approximately 150 nm is formed and, subsequently, the high-density n-type amorphous silicon layer (a-Si film) 7 having a thickness of 20 nm to 50 nm is formed on the amorphous silicon layer 5.

The formation of the amorphous silicon layer 5 and the formation of the high-density n-type amorphous silicon layer 7 are continuously performed using a CVD (Chemical Vapor Deposition) device, for example.

Figure 4A:
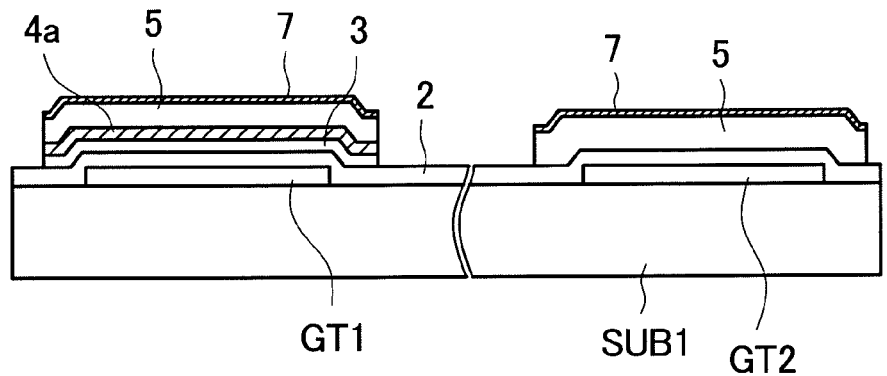
FIG. 4A to FIG. 4C are step views showing one embodiment of the manufacturing method of the thin film transistor which is formed on the substrate of the display device according to the present invention.

Step 6: (FIG. 4A)

A stacked body of the amorphous silicon layer 5 and the high-density n-type amorphous silicon layer 7 is left in the region where the semiconductor layer of each thin film transistor TFT is formed and is removed in other regions by an etching method using a photolithography technique.

Due to such treatment, with respect to the thin film transistor TFT1 formed in the peripheral circuit, the amorphous silicon layer 5 and the high-density n-type amorphous silicon layer 7 are sequentially stacked on the pseudo single crystal layer 4a.

Figure 4B:
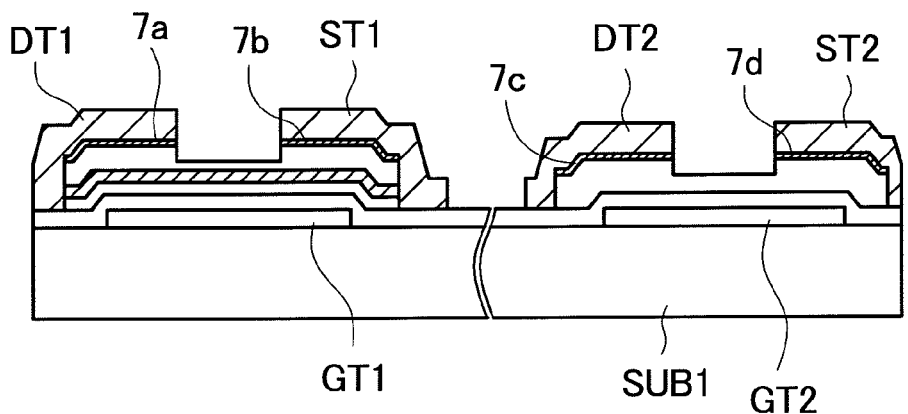

Step 7: (FIG. 4B)

On the surface of the substrate SUB1, a metal film which contains Al as a main component, for example, is formed. Here, by selective etching using a photolithography technique, the drain electrode DT1 and the source electrode ST1 of the thin film transistor TFT1 are formed in the transistor forming region of the peripheral circuit and, at the same time, the drain electrode DT2 and the source electrode ST2 of the thin film transistor TFT2 are formed in the transistor forming region of the pixel region.

Then, the respective high-density n-type amorphous silicon layers 7 which are formed between the drain electrodes DT1, DT2 and the source electrodes ST1, ST2 of the respective thin film transistors TFT1, TFT2 are over-etched thus sufficiently exposing the amorphous silicon layer 5 arranged below the high-density n-type amorphous silicon layers 7. Due to such treatment, the high-density n-type amorphous silicon layer 7 is formed between the drain electrodes DT1, DT2 and the amorphous silicon layer 5 as well as between the source electrodes ST1, ST2 and the amorphous silicon layer 5 (being respectively indicated by symbols 7a, 7c, 7b, 7d), and the high-density n-type amorphous silicon layer 7 functions as a contact layer.

Figure 4C:
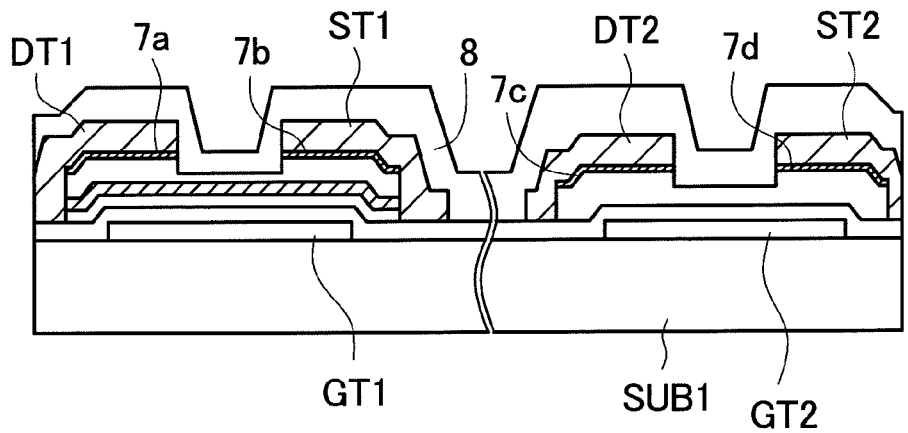

Step 8: (FIG. 4C)

Then, the silicon nitride film (SiN film) 8 is formed on the surface of the glass substrate SUB1 using a CVD method, for example. The silicon nitride film 8 is formed so as to cover the respective thin film transistors TFT and functions as a protective film, for example.

(Comparison Between the Constitution of the Thin Film Transistor of the Present Invention and the Constitution of the Conventional Thin Film Transistor)

Figure 5A:
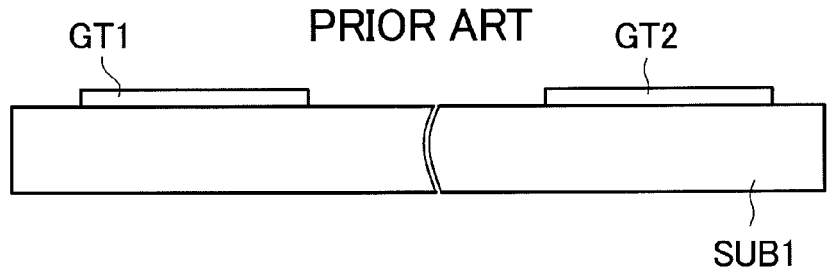
FIG. 5A to FIG. 5D are step views showing one example of a manufacturing method of a thin film transistor which is formed on a substrate of a conventional display device.
Figure 5B:
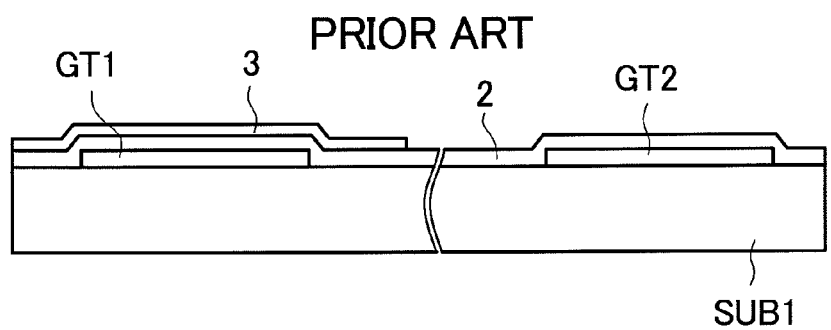
Figure 5C:
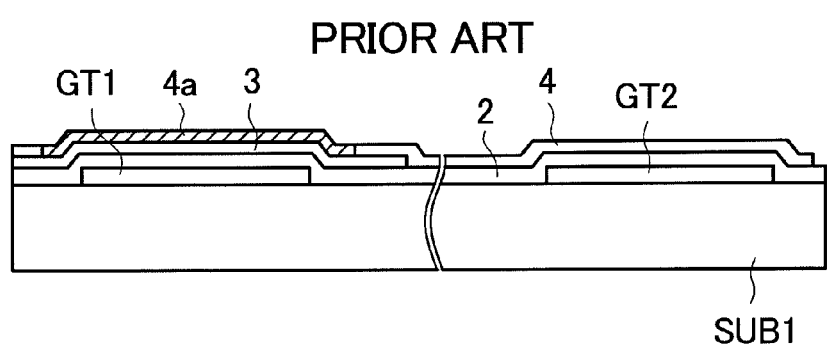
Figure 5D:
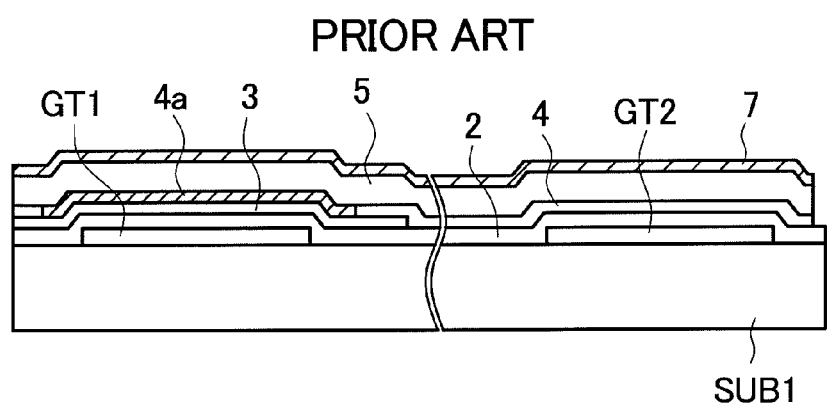
Figure 6A:
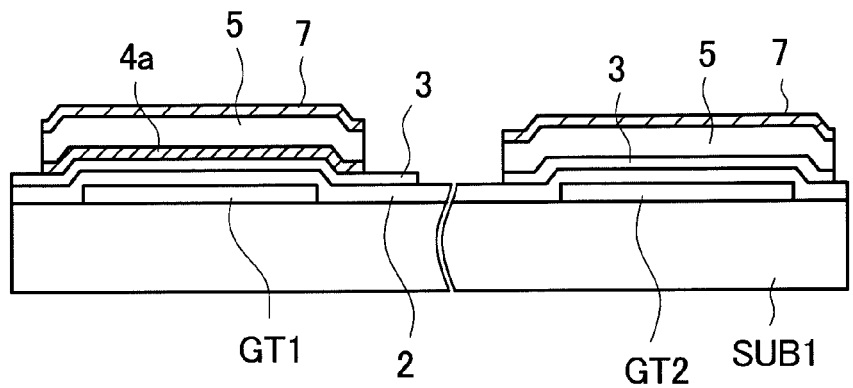
FIG. 6A to FIG. 6C are step views showing one example of the manufacturing method of the thin film transistor which is formed on the substrate of the conventional display device.
Figure 6B:
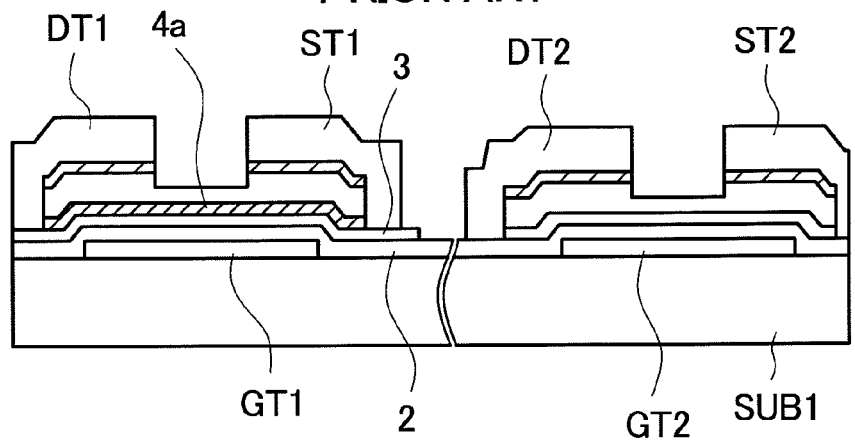
Figure 6C:
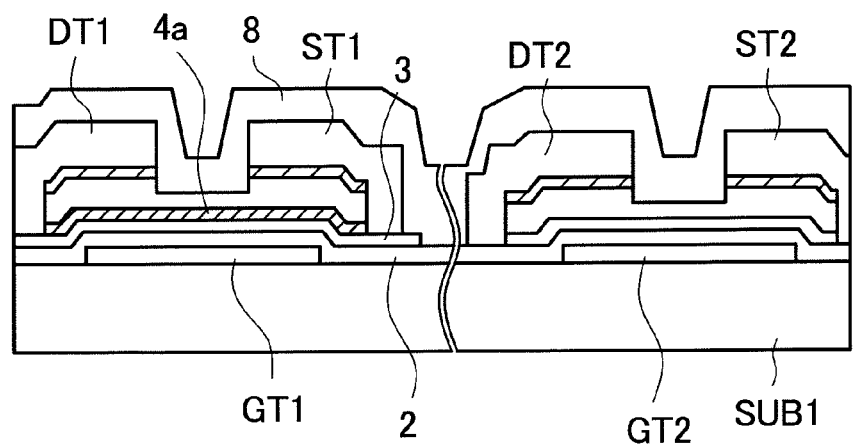

FIG. 5 and FIG. 6 are step views showing one example of a manufacturing method of conventional thin film transistors TFT1, TFT2. FIG. 5 and FIG. 6 are respectively provided corresponding to FIG. 3 and FIG. 4. In FIG. 5 and FIG. 6, parts identical with the parts used in FIG. 3 and FIG. 4 are given same numerals or symbols.

Accordingly, the explanation is made with respect to only the constitution shown in FIG. 5 and FIG. 6 which differs from the constitution shown in FIG. 3 and FIG. 4, and the constitution shown in FIG. 5 and FIG. 6 which is equal to the constitution shown in FIG. 3 and FIG. 4 is omitted.

First of all, as shown in FIG. 5B, after forming a silicon nitride film 2, a silicon oxide film 3 is formed. By selectively removing the silicon oxide film 3, the silicon oxide film 3 is left in a region where a peripheral circuit is formed, for example.

Then, an amorphous silicon layer 4 is formed. By selectively applying laser annealing to a portion of the amorphous silicon layer 4 which corresponds to a region where a semiconductor layer of the thin film transistor TFT1 of the peripheral circuit is formed thus forming a pseudo single crystal layer 4a by modifying the amorphous silicon layer 4.

Due to such treatment, a step for selectively etching the silicon oxide film 3 is performed in the course of the formation of each one of the silicon nitride film 2, the silicon oxide film 3 and the amorphous silicon layer 4 and hence, it is understood that the continuous formation of these films using the same CVD device, for example, cannot be achieved.

To the contrary, in this embodiment, as shown in FIG. 3B, the formation of silicon nitride film 2, the formation of the silicon oxide film 3 and the formation of the amorphous silicon layer 4 are continuously performed and hence, the formation of these films can be performed using the same CVD device, for example. Accordingly, it is possible to form the electrically reliable gate insulation film while preventing the intrusion of a foreign material into each film or an interface between the films or the contamination of the films.

Further, as shown in FIG. 6A, after forming the amorphous silicon layer 5, the amorphous silicon layer 5 is selectively etched thus forming amorphous silicon layers 5 in an island-shape for every thin film transistor.

In this case, with respect to the thin film transistor TFT1 formed in the peripheral circuit, although the amorphous silicon layer 5 is selectively etched together with the amorphous silicon layer 4 arranged below the amorphous silicon layer 5, the silicon oxide film 3 arranged below the amorphous silicon layer 4 is not etched.

Accordingly, the silicon oxide film 3 is formed in a state that the silicon oxide film 3 projects from the semiconductor layer (the pseudo single crystal layer 4a, the amorphous silicon layer 5) of the thin film transistor TFT1 and, for example, is formed to extend over the region where the peripheral circuit is formed.

Due to such constitution, with respect to the respective thin film transistor TFT1, for example, in establishing the electric connection between the gate electrode GT1 and the drain electrode DT1 (or the source electrode ST1) via a through hole, the through hole is formed in a sequentially-stacked body constituted of the silicon nitride film 2 and the silicon oxide film 3.

Figure 7:
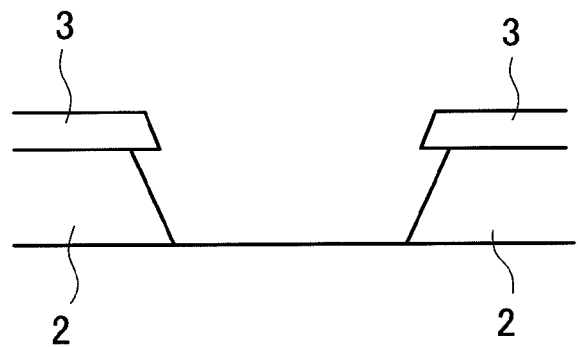
FIG. 7 is an explanatory view showing a drawback of the conventional display device.

In this case, when the through hole is formed in the sequentially-stacked body constituted of the silicon nitride film 2 and the silicon oxide film 3, as shown in FIG. 7 which is a cross-sectional view of the through hole, the silicon nitride film 2 is undercut below the silicon oxide film 3. In other words, an inner wall surface of the through hole formed in the silicon nitride film 2 is overetched compared to an inner wall surface of the through hole formed in the silicon oxide film 3.

Accordingly, in forming wiring or lines made the metal film via such a through hole, it is unavoidable that a broken step of the metal film easily occurs on the inner wall surface of the through hole.

To the contrary, in this embodiment, as shown in FIG. 4A, a portion of the region where the peripheral circuit is formed on which the silicon oxide film 3 is formed is formed only below the respective semiconductor layers (the pseudo single crystal layer 4a, the amorphous silicon layer 5) of the thin film transistor TFT1 and hence, as described above, there is no possibility that the silicon oxide film 3 is formed on the portion where the through hole connects of the gate electrode GT1 and the drain electrode DT1 (or the source electrode ST1), and only the silicon nitride film 2 is formed. Due to such constitution, it is possible to acquire an advantageous effect that the inner wall surface of the through hole can be continuously formed without a stepped portion.

Another Embodiment

In the above-described embodiment, the thin film transistor TFT1 which includes the semiconductor layer obtained by pseudo single crystallizing the amorphous silicon layer is assembled in the peripheral circuit which drives the pixels.

However, in a display device incorporating therein time-division switches SW(R), SW(G), SW(B) which supply video signals by time division when the video signals are supplied to the pixels respectively allocated to red(R), green (G) and blue(B) via the drain signal line DL, the thin film transistor TFT1 may be applied to these time-division switches SW(R), SW(G), SW(B).

Figure 8:
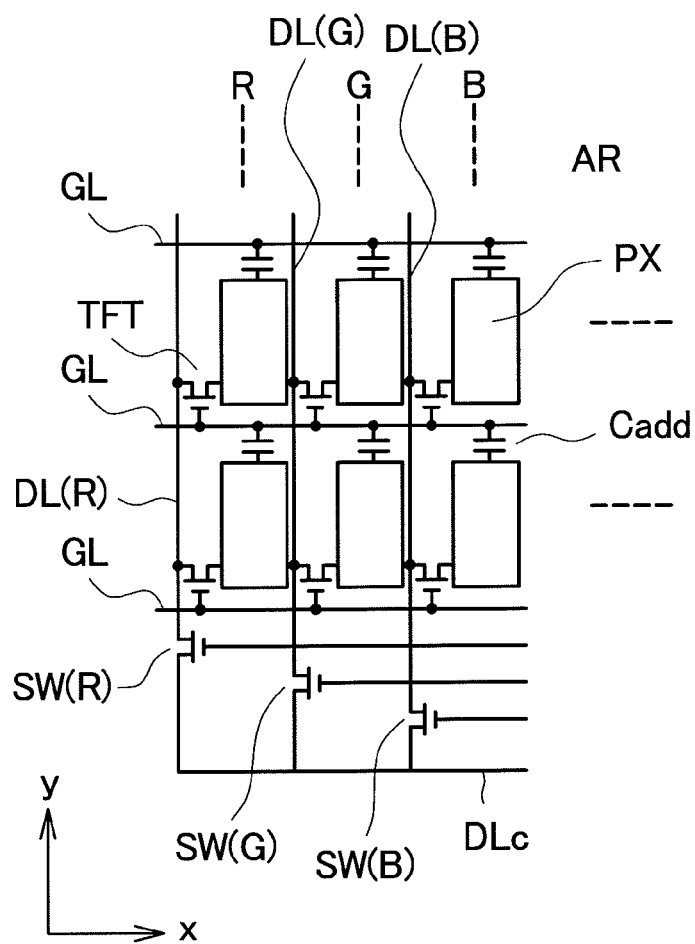
FIG. 8 is an explanatory view showing another embodiment of the display device according to the present invention.

FIG. 8 is a schematic plan view of a display device in which the time-division switches SW(R), SW(G), SW(B) are arranged on a lower side of a display region AR in the drawing, for example.

In respective pixels within the display region AR, for example, the pixels arranged parallel to each other in the y direction in the drawing are allocated to a common color, while these pixels are respectively allocated to red(R), green (G) and blue(B) in order from a left side to a right side in the drawing, and such allocation is sequentially repeated in the display region AR.

In the drawing, to the drain signal line DL (indicated by symbol DL(R) in the drawing) which is in common with the pixels allocated to red(R), the video signal is supplied from the drain signal line DLc via the time-division switch SW(R). Further, in the drawing, to the drain signal line DL (indicated by symbol DL(G) in the drawing) which is in common with the pixels allocated to green(G), the video signal is supplied from the drain signal line DLc via the time-division switch SW(G). Further, in the drawing, to the drain signal line DL (indicated by symbol DL(B) in the drawing) which is in common with the pixels allocated to blue(B), the video signal is supplied from the drain signal line DLc via the time-division switch SW(B).

Due to the supply of signals to gate electrodes of the time-division switches SW(R), SW(G) and SW(B), the time-division switches SW(R), SW(G) and SW(B) are respectively turned on in this order, for example. The video signal is supplied to the corresponding drain signal line DL via the drain signal line DLc at timing that the corresponding switch is turned on.

The display device having such constitution can be configured to supply the video signal to three drain signal lines DL through one drain signal line DLc from the video signal drive circuit (see FIG. 2).

The above-mentioned respective embodiments may be used in a single form or in combination. This is because the advantageous effects of the respective embodiments can be achieved independently or synergistically.

What is claimed is:

1. A display device, comprising:
    a first thin film transistor and a second thin film transistor on a substrate;
    wherein the first thin film transistor includes:
        a first gate electrode covered by a silicon nitride film,
        a silicon oxide film selectively formed on the silicon nitride film,
        a first semiconductor layer formed at least on an upper surface of the silicon oxide film and formed of pseudo single crystal silicon or polycrystalline silicon,
        a second semiconductor layer formed at least on an upper surface of the first semiconductor layer and formed of amorphous silicon, and
        a first drain electrode an a first source electrode which are formed on an upper surface of the second semiconductor layer by way of a first contact layer;
    wherein the second thin film transistor includes:
        a second gate electrode covered by the silicon nitride film,
        a third semiconductor layer formed at least on and in physical contact with an upper surface of the silicon nitride film and formed of amorphous silicon, and
        a second drain electrode and a second source electrode which are formed on an upper surface of the third semiconductor layer by way of a second contact layer;

wherein the second gate electrode of the second thin film transistor is formed at the same layer as the first gate electrode of the first film transistor;

wherein the third semiconductor layer of the second thin film transistor is the same layer as the second semiconductor layer of the first thin film transistor;

wherein the second contact layer of the second thin film transistor is the same layer as the first contact layer of the first thin film transistor; and wherein a peripheral-side wall surface of first semiconductor layer is contiguously constituted with a peripheral-side wall surface of the silicon oxide film below the first semiconductor layer without a stepped portion.

2. A display device according to claim 1, wherein the second thin film transistors are formed in respective pixels of a display region, and the first thin film transistors are formed in a peripheral circuit around the display region.

3. A display device according to claim 2, wherein the peripheral circuit includes switching elements which are configured to supply video signals to respective pixels allocated to red(R), green(G) and blue(B) by time-division driving, wherein the switching element is constituted of the first thin film transistor.

4. A method of manufacturing a display device which forms a first thin film transistor and a second thin film transistor on a substrate of the display device, wherein the first thin film transistor includes:
a first gate electrode covered by a silicon nitride film,
a silicon oxide film selectively formed on the silicon nitride film,
a first semiconductor layer formed at least on an upper surface of the silicon oxide film and formed of pseudo single crystal silicon or polycrystalline silicon,
a second semiconductor layer formed at least on an upper surface of the first semiconductor layer and formed of amorphous silicon, and
a first drain electrode and a first source electrode which are formed on an upper surface of the second semiconductor layer by way of a first contact layer, wherein the second thin film transistor includes:
a second gate electrode covered by the silicon nitride film,
a third semiconductor layer formed at least on an upper surface of the silicon nitride film and formed of amorphous silicon,
a second drain electrode and a second source electrode which are formed on and in physical contact with an upper surface of the third semiconductor layer by way of a second contact layer, wherein the second gate electrode of the second thin film transistor is formed at the same layer as the first gate electrode of the first thin film transistor, wherein the third semiconductor layer of the second thin film transistor is the same layer as the second semiconductor layer of the first thin film transistor, wherein the second contact layer of the second thin film transistor is the same layer as the first contact layer of the first thin film transistor, and wherein the first semiconductor layer is formed by crystallizing an amorphous silicon layer, the method of manufacturing the display device comprising the steps of:
forming the silicon nitride film, the silicon oxide film and the amorphous silicon layer sequentially and continuously;
forming the first semiconductor layer by selectively crystallizing the amorphous silicon layer; and
etching the silicon oxide film positioned below the amorphous silicon layer at the same time as etching the amorphous silicon layer, while leaving the first semiconductor layer unetched.

5. A display device, comprising:
(1) a first film transistor on a substrate, that includes:
a first gate electrode covered by a silicon nitride film,
a silicon oxide film selectively formed on the silicon nitride film,
a first semiconductor layer formed at least on an upper surface of the silicon oxide film and formed of pseudo single crystal silicon or polycrystalline silicon,
a second semiconductor layer formed at least on an upper surface of the first semiconductor layer and formed of amorphous silicon, and
a first drain electrode and a first source electrode which are formed on an upper surface of the second semiconductor layer by way of a contact layer; and (2) a second thin film transistor on the substrate, that includes:
a second gate electrode covered by the silicon nitride film, and formed at the same layer as the first gate electrode of the first thin film electrode,
a third semiconductor layer formed at least on and in physical contact with an upper surface of the silicon nitride film and formed of amorphous silicon, the third semiconductor layer being the same layer as the second semiconductor layer of the first thin film transistor, and
a second drain electrode and a second source electrode which are formed on an upper surface of the third semiconductor layer by way of the contact layer;

wherein a peripheral-side wall surface of the first semiconductor layer is contiguously constituted with a peripheral-side wall surface of the silicon oxide film below the first semiconductor layer without a stepped portion.

6. A method of manufacturing a display device which forms a first thin film transistor and a second thin film transistor on a substrate of the display device, the method comprising the steps of:
forming a silicon nitride film, a silicon oxide film and an amorphous silicon layer sequentially and continuously;
forming a first semiconductor layer by selectively crystallizing a portion of the amorphous silicon layer; and
etching the silicon oxide film positioned below the amorphous silicon layer at the same time as etching the amorphous silicon layer, while leaving the first semiconductor layer unetched.

7. The method of manufacturing a display device of claim 6,
wherein (1) the first thin film transistor includes:
a first gate electrode covered by a silicon nitride film,
a silicon oxide film selective formed on the silicon nitride film,
a first semiconductor layer, formed by crystallizing an amorphous silicon layer, and formed at least on an upper surface of the silicon oxide film and formed of pseudo single crystal silicon or polycrystalline silicon,
a second semiconductor layer formed at least on an upper surface of the first semiconductor layer and formed of amorphous silicon, and
a first drain electrode and a first source electrode which are formed on an upper surface of the second semiconductor layer by way of a contact layer; and (2) wherein the second thin film transistor includes:
- a second gate electrode covered by the silicon nitride film, the second gate electrode being formed at the same layer as the first gate electrode of the first thin film transistor,
- the second semiconductor layer, formed at least on an upper surface of the silicon nitride film and formed of amorphous silicon,
- a third semiconductor layer formed at least on an upper surface of the silicon nitride film and formed of amorphous silicon, wherein the third semiconductor layer of the second thin film transistor is the same layer as the second semiconductor layer of the first thin film transistor, and
- a second drain electrode and a second source electrode which are formed on and in physical contact with an upper surface of the third semiconductor layer by way of a contact layer.

* * * * *